(12) United States Patent
Hsu et al.

(10) Patent No.: US 6,501,685 B2
(45) Date of Patent: Dec. 31, 2002

(54) CHANNEL WRITE/ERASE FLASH MEMORY CELL AND ITS MANUFACTURING METHOD

(75) Inventors: Ching-Hsiang Hsu, Hsin-Chu (TW); Ching-Sung Yang, Chang-Hua Hsien (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 09/683,580

(22) Filed: Jan. 22, 2002

(65) Prior Publication Data

US 2002/0136058 A1 Sep. 26, 2002

(30) Foreign Application Priority Data

Jan. 30, 2001 (TW) ........................................ 90101747 A

(51) Int. Cl.[7] .............................................. G11C 16/04
(52) U.S. Cl. ......................... 365/185.33; 365/185.27; 365/185.29; 257/315; 257/316
(58) Field of Search ................... 365/185.18, 185.27, 365/185.28, 185.29, 185.33; 257/315, 316

(56) References Cited

U.S. PATENT DOCUMENTS

| | | | |
|---|---|---|---|
| 5,592,003 A | | 1/1997 | Sato et al. .................. 257/316 |
| 5,872,734 A | | 2/1999 | Tanaka et al. ........... 365/185.18 |
| 5,900,656 A | * | 5/1999 | Park ............................ 257/316 |
| 5,907,506 A | * | 5/1999 | Jinbo ...................... 365/185.29 |
| 6,091,644 A | | 7/2000 | Hsu et al. ............... 365/185.29 |
| 6,133,604 A | * | 10/2000 | Chi ............................. 257/315 |
| 6,169,692 B1 | * | 1/2001 | Ohkawa ................. 365/185.29 |
| 6,292,400 B1 | * | 9/2001 | Dozza et al. ........... 365/185.29 |
| 6,320,789 B1 | * | 11/2001 | Chen et al. ............. 365/185.18 |

FOREIGN PATENT DOCUMENTS

EP          0 905 790          3/1999

* cited by examiner

Primary Examiner—Trong Phan
(74) Attorney, Agent, or Firm—Winston Hsu

(57) ABSTRACT

A pseudo-dynamic operating method and a flash memory cell capable of performing this operating method are disclosed. A parasitic capacitor near the drain terminal of the flash memory can be charged in few microseconds during operation. Interference generated between the floating gate and the source is avoided by using a first oxide layer which is thicker at the interface between floating gate and source and thinner near central part under stacked gate.

15 Claims, 5 Drawing Sheets

CHANNEL WRITE/ERASE FLASH MEMORY CELL AND ITS MANUFACTURING METHOD

BACKGROUND OF INVENTION

1. Field of the Invention

The present invention relates to a nonvolatile memory cell, and more particularly, to a channel write/erase flash memory cell and its manufacturing method.

2. Description of the Related Art

Please refer to FIG. 1. FIG. 1 is a cross-sectional view of a conventional flash memory cell 10. It includes a substrate 11, a first field oxide layer 12, a stacked gate 14, an N-type doping region 16, a shallow P-type doping region 18, a deep P-type doping region 20, and a source region 22.

The stacked gate 14 includes a control gate 13 and a floating gate 15 under the control gate 13. The N-type doping region 16 is formed between the first field oxide layer 12 and the stacked gate 14. The shallow P-type doping region 18 is formed next to the N-type doping region 16 and under the stacked gate 14. The deep P-type doping region 20 and the shallow P-type region 18 are doped with the same type of dopants. The deep P-type doping region 20 is formed under the N-type doping region 16 and is in contact with the first field oxide layer 12 and also the shallow P-type doping region 18. The deep P-type doping region 20 functions as a P well and its well depth is much deeper than the well depth of the shallow P-type doping region 18. The deep P-type doping region 20 and the N-type doping region 16 are electrically connected which functions as a drain terminal of the flash memory cell 10. The source region 22, functioning as a source terminal of the flash memory cell 10, is formed next to the shallow P-type region 18. Additionally, under the source region 22 a lightly doped region 24 is formed which is doped with the same type of dopants like the source region 22 but with a lighter density.

The programming method of the flash memory cell 10 will be explained below. When programming the flash memory cell 10, a word line voltage $V_{WL}=-10$ V is applied to the control gate 13, a bit line voltage $V_{BL}=5$ V is applied to the drain terminal, i.e. the shorted N-type doping region 16 and the deep P-type doping region 20, and no voltage is applied to the source terminal 22 so as to make it floating. Under this programming condition, electrons will eject from the floating gate 15 to the drain terminal due to the edge Fowler-Nordheim effect thereby achieving the effect of programming the flash memory cell 10.

However, in the above conventional programming method, a series of flash memory cells are programmed in a cell-by-cell sequence. As shown in FIG. 2, two flash memory cells 30 and 32 arranged in parallel are shown. Typically, it takes about 4ms to complete the programming of one flash memory cell when a bit line voltage $V_{BL}=5$ V is applied to the flash memory cells 30 and 32. If 10 parallel flash memory cells are to be programmed, it will take 40 ms (10*4 ms) to complete the programming job. It means a great deal of time is needed when using the conventional programming method. Consequently, there is a need to provide a more effective flash memory structure and programming method.

SUMMARY OF INVENTION

Accordingly, it is the primary objective of the present invention to provide a new channel write/erase flash memory cell structure and also a new programming method.

In another aspect, the present invention provides a programming method in which a parasitic capacitor is used to temporally store bit line data to significantly increase the programming speed.

In one further aspect, the present invention provides a method of forming the aforementioned channel write/erase flash memory cell structure.

To achieve these and other advantages and in accordance with the purpose of the claimed invention, as embodied and broadly described herein, the present invention provides a channel write/erase flash memory cell structure capable of providing a pseudo-dynamic programming method. The structure includes a substrate of first conductivity type, a deep ion well of second conductivity type, an ion well of first conductivity type, a first oxide layer, a stacked gate, a doping region of first conductivity type, a shallow doping region of second conductivity type, and a deep doping region of second conductivity type.

The deep ion well of second conductivity type is formed in the substrate. The ion well of first conductivity type is positioned above the deep ion well of second conductivity type to create a parasitic capacitor during programming. The first oxide layer is formed on the substrate above the ion well of first conductivity type. The stacked gate is formed next to the first oxide layer and over the ion well of first conductivity type. The doping region of first conductivity type is positioned under the first oxide layer and on one side of the stacked gate to function as a drain. The shallow doping region of second conductivity type is formed next to the doping region of first conductivity type and under the stacked gate. The deep doping region of second conductivity type is positioned under the doping region of first conductivity type and is in contact with the shallow doping region of second conductivity type.

In the preferred embodiment of the present invention, the first conductivity type is N type and the second conductivity type is P type. The first oxide layer extends into the stacked gate with a decreasing oxide thickness for reducing interference during operation.

Further, a source doping region is formed next to the shallow doping region of second conductivity type and under the first oxide layer to function as a source terminal. The doping region of first conductivity type and the source doping region are doped with VA elements such as phosphorus. The shallow doping region of second conductivity type and the deep doping region of second conductivity type are both doped with IIIA elements such as boron.

Furthermore, the doping region of first conductivity type and the deep doping region of second conductivity type are short-circuited together by using, for example, a metal contact penetrating through the doping region of first conductivity type to the deep doping region of second conductivity type, or, alternatively, by using a metal contact formed across exposed doping region of first conductivity type and the deep doping region of second conductivity type.

Additionally, the present invention provides a method of forming a channel write/erase flash memory cell capable of performing a pseudo-dynamic programming method. The structure is formed by providing a substrate of first conductivity type, and then forming a deep ion well in the substrate. Next, an ion well of first conductivity type is formed in the deep ion well of second conductivity type. A first oxide layer is then formed over the ion well of first conductivity type. A stacked gate is formed later partially over the first oxide layer. A doping region of first conductivity type acting as a drain is formed under the first oxide layer and next to the stacked gate. A shallow doping region of second conductivity type is formed next to the doping region of first conductivity type and under the stacked gate. A deep doping region of second conductivity type is formed under the doping region of first conductivity type and is in contact with the shallow doping region of second conductivity type.

The method according to the present invention further includes a source doping region acting as a source terminal formed next to the shallow doping region of conductivity type and under the first oxide layer. A metal contact is formed to short-circuit the doping region of first conductivity type and the deep doping region of second conductivity type. Or, a metal contact can be formed across the exposed doping region of first conductivity type and the deep doping region of second conductivity type so that these two regions can be short-circuited together. In one preferred embodiment according to the present invention, the substrate and the ion well of first conductivity type are both doped with N type dopants, and the deep ion well of second conductivity type is doped with P type dopants. To avoid interference during operation, the first oxide layer has a thickness that is thinner under the central part of the stacked gate and is thicker at two sides of the stacked gate.

Additionally, the present invention provides a pseudo-dynamic programming method for programming the channel write/erase flash memory cell. When programming, a word line voltage $V_{WL}$, a source line voltage $V_{SL}$, and a bit line voltage $V_{BL}$ are applied respectively to control gate, source terminal, and drain terminal of the flash memory cell. An N well, a deep P well and an N substrate are positioned in order under the flash memory cell. A well voltage $V_P$ is applied to the deep P well. The N well and the deep P well constitute a parasitic capacitor when programming the flash memory cell.

When performing an erase operation, the word line voltage $V_{WL}$ is in a high voltage level, the source line voltage $V_{SL}$ is in a voltage level relatively lower than the word line voltage $V_{WL}$, and the bit line voltage $V_{BL}$ is floating. The well voltage $V_P$ and the source line voltage $V_{SL}$ are the same. When performing a programming operation, the word line voltage $V_{WL}$ is in a low voltage level, the bit line voltage $V_{BL}$ is in a voltage level relatively higher than the word line voltage $V_{WL}$, and the source line voltage $V_{SL}$ is floating. The well voltage $V_P$ is in a voltage level higher than the word line voltage $V_{WL}$ but lower than the bit line voltage $V_{BL}$.

When performing a read operation, the word line voltage $V_{WL}$ is in a high voltage level, the source line voltage $V_{SL}$ is in a voltage level relatively lower than the word line voltage $V_{WL}$ and the bit line voltage $V_{BL}$ is in a voltage level relatively lower than the source line voltage $V_{SL}$. The well voltage $V_P$ is in a voltage level lower than the source line voltage $V_{SL}$.

It is to be understood that both the forgoing general description and the following detailed description are exemplary, and are intended to provide further explanation of the invention as claimed. Other advantages and features of the invention will be apparent from the following description, drawings and claims.

DETAILED DESCRIPTION

Figure 1:
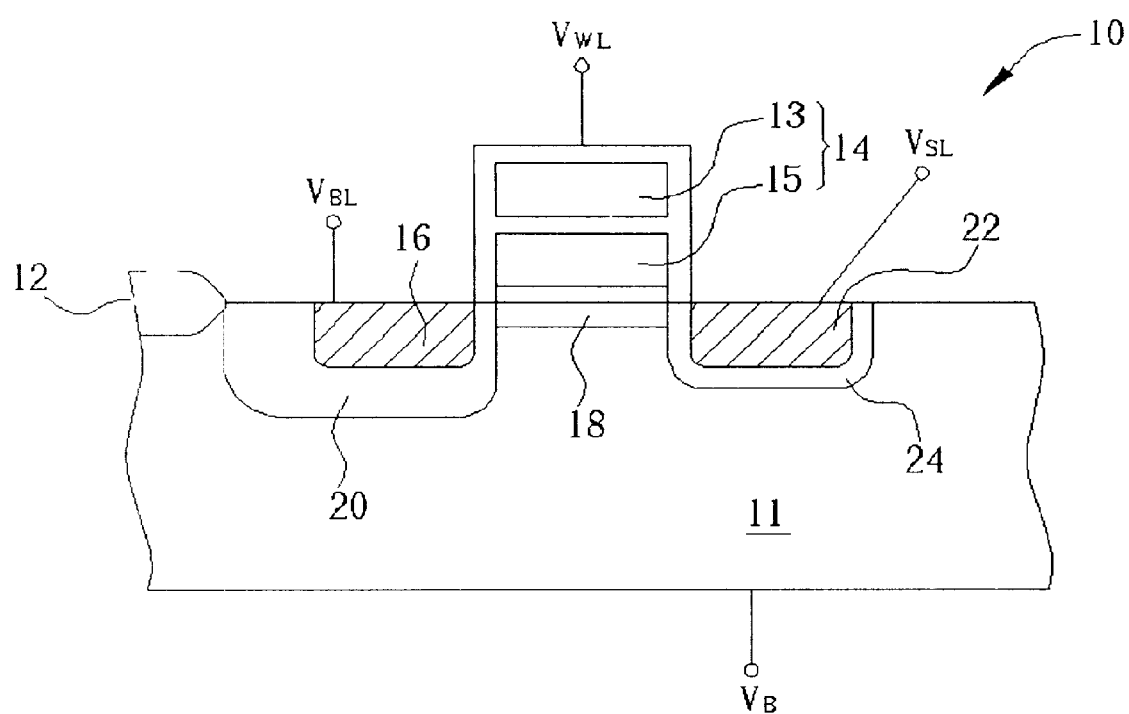
FIG. 1 is a cross-sectional view of a conventional flash memory cell.
Figure 2:
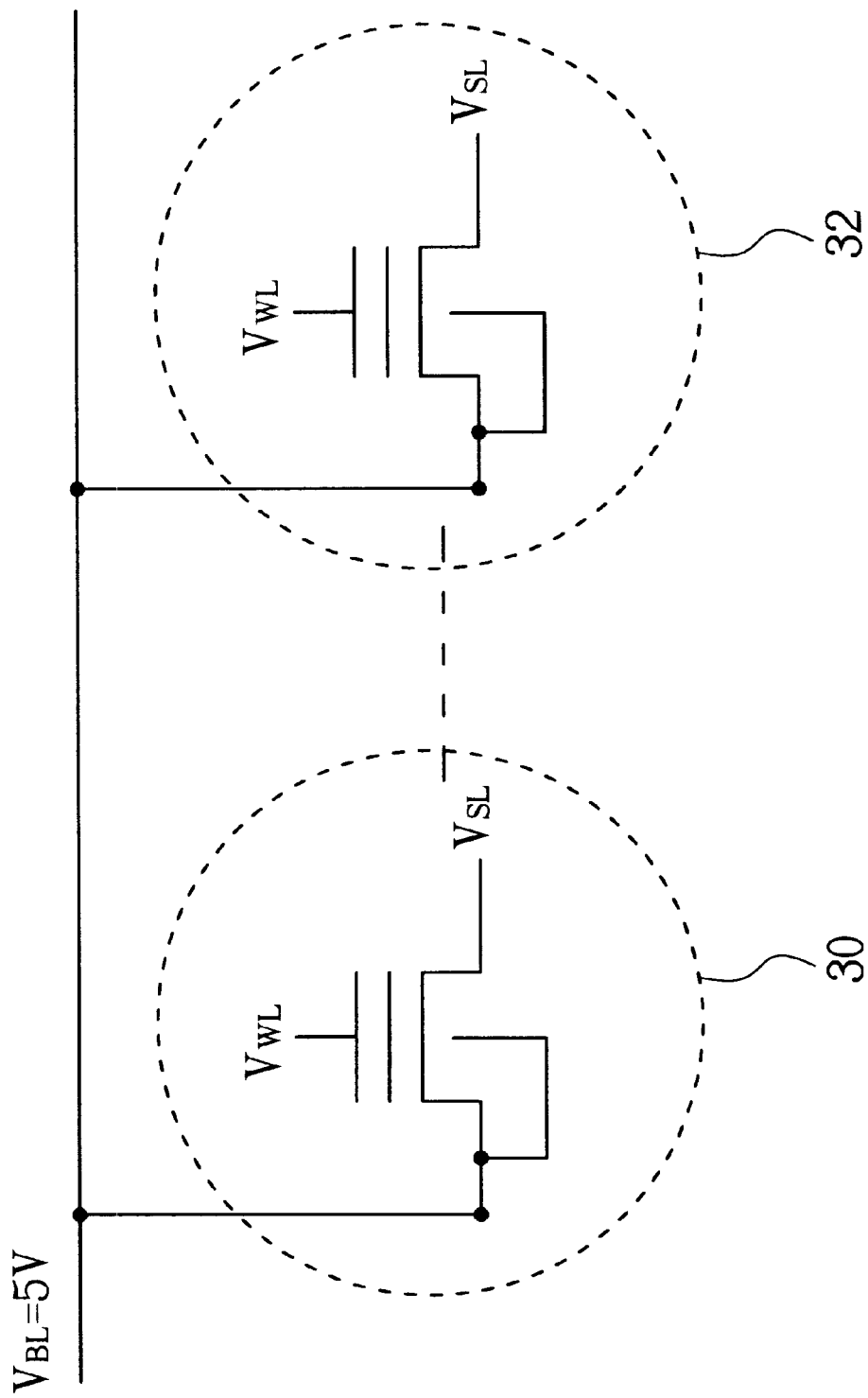
FIG. 2 is a schematic diagram depicting a series of memory cells.
Figure 3:
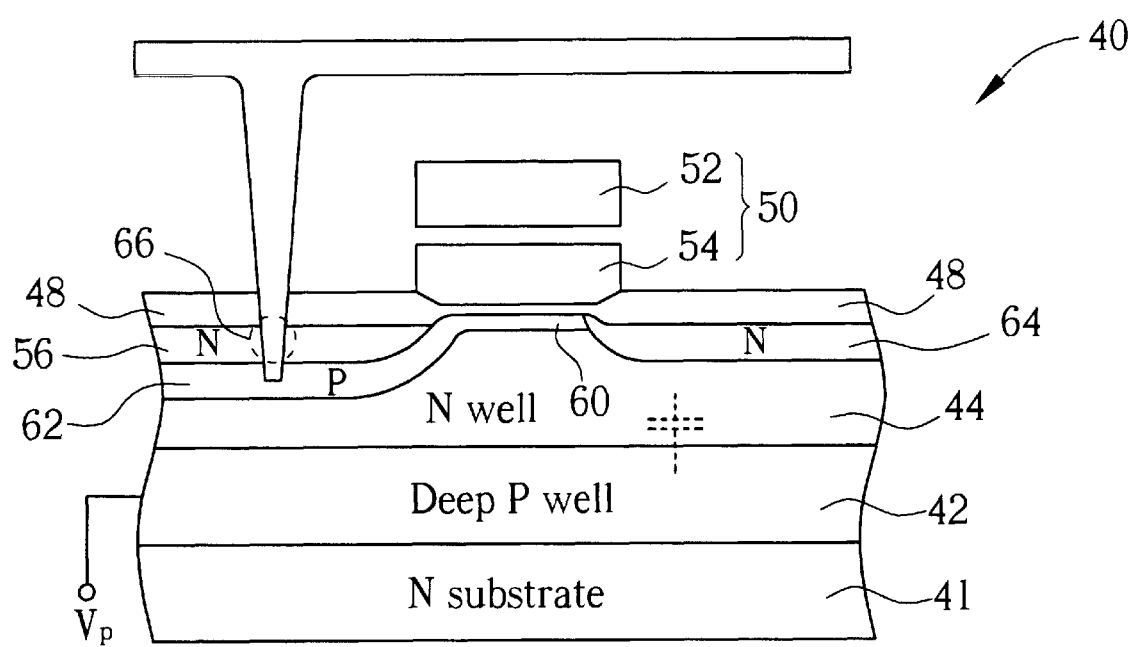
FIG. 3 is a cross-sectional view showing the structure of the channel write/erase flash memory cell according to the present invention.
Figure 4:
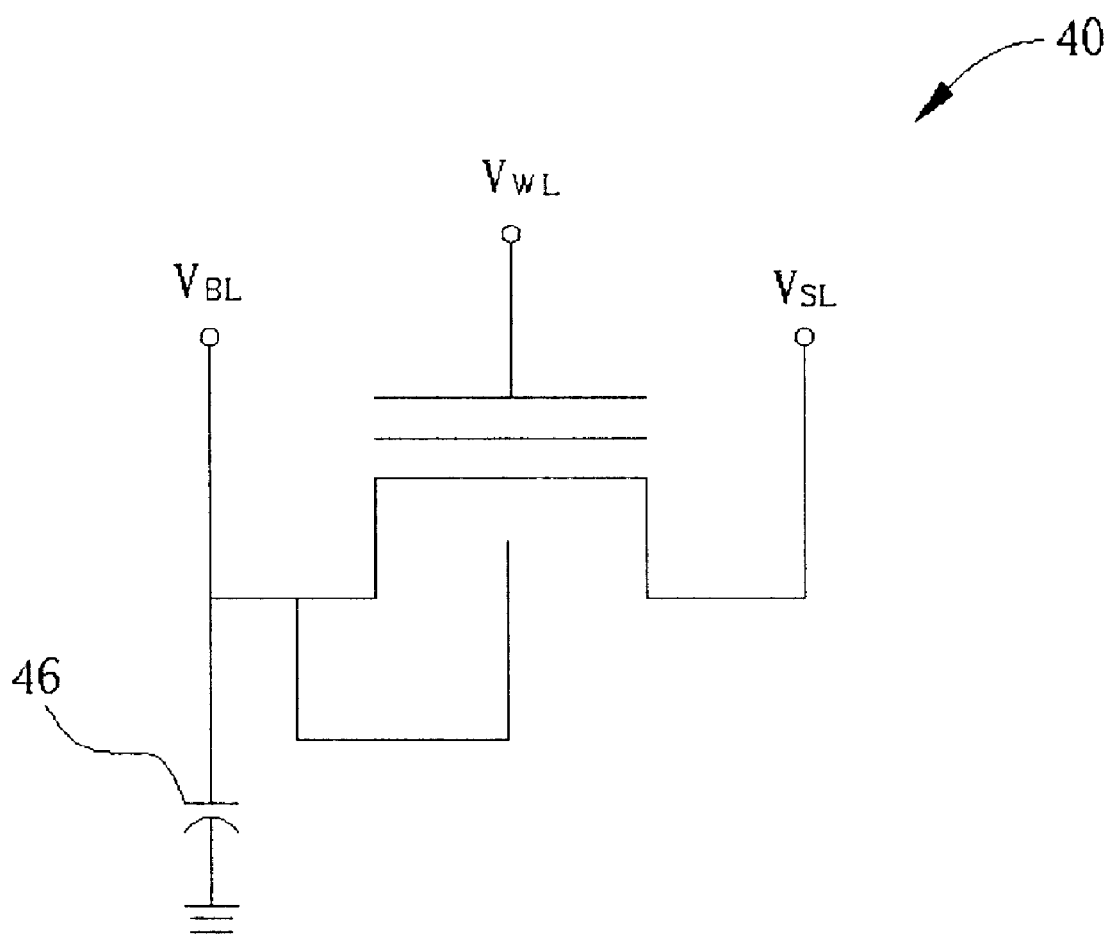
FIG. 4 is an equivalent circuit of the channel write/erase flash memory cell shown in FIG. 3.

Please refer to FIGS. 3 and 4. FIG. 3 is a cross-sectional view showing the structure of the channel write/erase flash memory cell 40 and FIG. 4 shows the equivalent circuit of the flash memory cell 40. The flash memory cell 40 is built upon an N substrate 41 which comprises a deep P well 42 above the N substrate 41 and a N well 44 above the deep P well 42. The deep P well 42 and the N well 44 constitute a parasitic capacitor 46 (shown in the equivalent circuit diagram) that facilitates the programming speed of the flash memory cell 40. The parasitic capacitor 46 will be discussed in detail hereinafter.

A first oxide layer 48 is formed over the N well 44, and a stacked gate 50 having a control gate 52 and a floating gate 54 is formed partially over the first oxide layer 48. An N doping region 56 acting as a drain terminal is formed under the first oxide layer next to the stacked gate 50. A shallow P doping region 60 is formed under the stacked gate 50 and next to the N doping region 56. A deep P doping region 62 is formed underneath the N doping region 56 and is contiguous with the P doping region 60. An N doping region 64 acting as a source is formed under the first oxide layer 48 and next to the shallow P doping region 60.

To avoid undesired interference between the floating source and the floating gate 54, the thickness of the first oxide layer 48 at the interface between the N doping region 64 and the floating gate 54 is thicker than the thickness near the central part under the stacked gate 50. That is, the first oxide layer 48 extends into the stacked gate 50 with a decreasing thickness. Such a design can avoid electrons ejection from the floating gate 54 to the high voltage source end. The N doping region 56 and the deep P doping region 62 are short-circuited together (marked in dash line 66) by a metal contact penetrating through the N doping region 56 to the deep P doping region 62. This prevents hot holes generated in the depletion region of the deep P doping region 62 from injecting into the floating gate 54 in the presence of lateral electric field. Alternatively, a metal contact may be formed across the exposed N doping region 56 and the deep P doping region 62 to short-circuit these two regions.

In this preferred embodiment of the invention, the N doping regions 56 and 64 are doped with VA elements such as phosphorus and the shallow P doping region 60 and the deep P doping region 62 are doped with IIIA elements such as boron.

Table 1 shows exemplary operating modes of the channel write/erase flash memory cell 40 of this invention. When operating the flash memory cell 40, a word line voltage $V_{WL}$, a source line voltage $V_{SL}$, and a bit line voltage $V_{BL}$ are applied, respectively, to the control gate 52, the source terminal 64, and the drain terminal 56 of the flash memory cell. As mentioned, N well 44, deep P well 42 and N substrate 41 is positioned in order under the flash memory cell 40. A well voltage $V_P$ is applied to the deep P well 42. The N well 44 and the deep P well 42 constitute a parasitic capacitor 46 when programming the flash memory cell.

TABLE 1

|  | $V_{BL}$ | | $V_{WL}$ | | $V_{SL}$ | $V_P$ |
| --- | --- | --- | --- | --- | --- | --- |
|  | selected | nonselected | selected | nonselected | | |
| program | 5 V | 0 V | −10 V | floating | floating | 0 V |
| erase | floating | floating | 10 V | floating | −8 V | −8 V |
| read | 0 V | floating | 3.3 V | floating | 1 V | 0 V |

In table 1, when programs a selected memory cell, a low voltage $V_{WL}=-10$ V is applied to the control gate of the selected memory cell, and the bit line voltage $V_{BL}$ is higher than the word line voltage $V_{WL}$ for example, $V_{BL}=5$ V. The source remains in a floating state ($V_{SL}$=floating). A well voltage $V_P=0$ V is applied to the deep P well 42.

When erases the selected memory cell, the word line voltage $V_{WL}$ (10 V) is in a high voltage level, and the source line voltage $V_{SL}$ (−8 V) is in a voltage level relatively lower than the word line voltage $V_{WL}$, and the bit line voltage $V_{BL}$ is floating. The well voltage $V_P$ (−8 V) and the source line voltage $V_{SL}$ are the same.

When read the selected memory cell, the word line voltage $V_{WL}$ (3.3 V) is in a high voltage level, the source line voltage $V_{SL}$ (1 V) is in a voltage level relatively lower than the word line voltage $V_{WL}$, and the bit line voltage $V_{BL}$ (0 V) is in a voltage level relatively lower than the source line voltage $V_{SL}$. The well voltage $V_P$ (0 V) is in a voltage level lower than the source line voltage $V_{SL}$.

Figure 5:
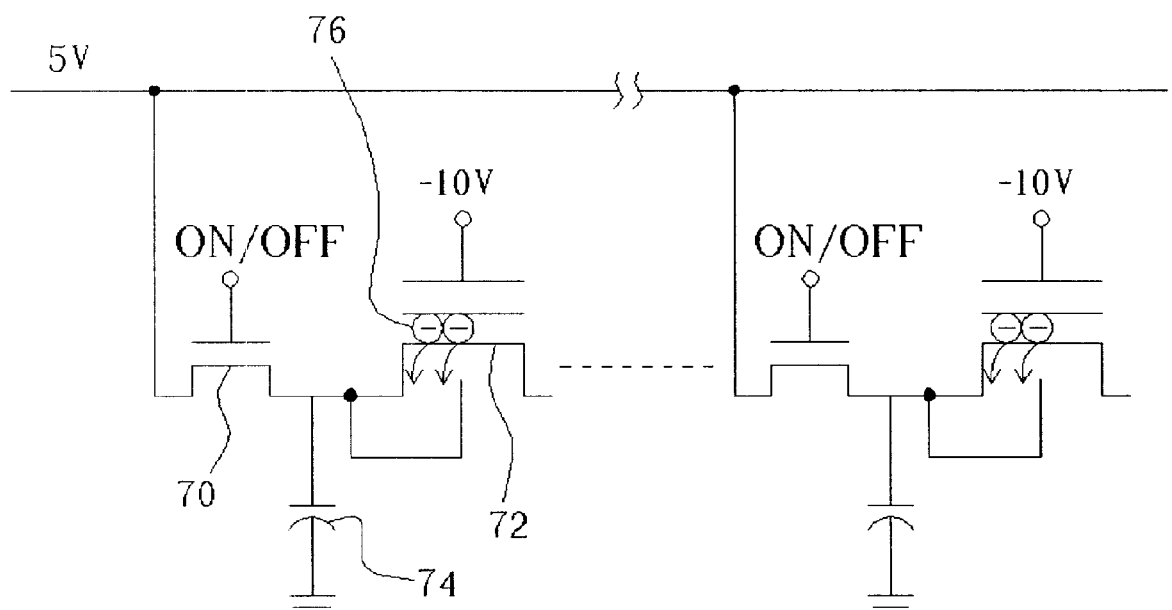
FIG. 5 is a circuit diagram showing the pseudo-dynamic operation of the channel write/erase flash memory cell according to the present invention.

FIG. 5 is a circuit diagram showing the pseudo-dynamic operation of the channel write/erase flash memory cell according to the present invention. A bit line voltage $V_{BL}=5$ V is controlled by a selecting transistor 70. When the transistor 70 is turned on, the drain and the parasitic capacitor 74 are charged to 5V in few microseconds (μ s), typically less than 10 μ s. The charged parasitic capacitor 74 is stand-by for subsequently ejecting electrons 76 from the floating gate to the drain. Unlike the conventional programming method which takes about 4 ms to complete the programming of one flash memory cell, the pseudo-dynamic program operation saves a great deal of time.

In summary, the present invention has the following advantages when comparing with the above-mentioned conventional flash memory. First, the parasitic capacitor near the drain terminal can be charged in few microseconds. Second, interference generated between the floating gate and the source is avoided by using the first oxide layer which is thicker at the interface between floating gate and the source and thinner near the central part under the stacked gate. And third, hot hole injection is also avoided since the N doping region and the deep P doping region are short-circuited together.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. A channel write/erase flash memory cell comprising:
   a first well region of a first conductivity type;
   a second well region of a second conductivity type formed above the first well region;
   a third well region of the first conductivity type formed above the second well region;
   a first oxide layer formed on the third well region;
   a stacked gate formed partially over the first oxide layer;
   a doping region of the first conductivity type acting as a drain formed next to the stacked gate and under the first oxide layer;
   a shallow doping region of second conductivity type formed under the stacked gate and next to the doping region of first conductivity type; and
   a deep doping region of second conductivity type formed underneath the doping region of first conductivity type and being contiguous with the shallow doping region of second conductivity type.

2. The channel write/erase flash memory cell of claim 1 wherein the first conductivity type is N type and the second conductivity type is P type.

3. The channel write/erase flash memory cell of claim 1 wherein the first oxide layer extends into the stacked gate with a decreasing oxide thickness to avoid undesired interference.

4. The channel write/erase flash memory cell of claim 1 further comprising a source doping region acting as a source formed under the first oxide layer and next to the shallow doping region of second conductivity type.

5. The channel write/erase flash memory cell of claim 1 wherein the doping region of first conductivity type and the deep doping region of second conductivity type are electrically short-circuited together.

6. The channel write/erase flash memory cell of claim 5 wherein the short-circuit electrical connection between the doping region of first conductivity type and the deep doping region of second conductivity type is obtained by using a metal contact that penetrates through the junction between the doping region of first conductivity type and the deep doping region of second conductivity type.

7. The channel write/erase flash memory cell of claim 5 wherein the short-circuit electrical connection between the doping region of first conductivity type and the deep doping region of second conductivity type is obtained by using a metal contact across exposed surface of the doping region of first conductivity type and exposed surface of the deep doping region of second conductivity type.

8. The channel write/erase flash memory cell of claim 5 wherein the stacked gate comprises a floating gate and a control gate positioned over the floating gate.

9. A flash memory cell comprising:
   a first well region of a first conductivity type;
   a second well region of a second conductivity type formed above the first well region;
   a third well region of the first conductivity type formed above the second well region;
   an oxide layer formed on the third well region;
   a stacked gate formed over the oxide layer, wherein the oxide layer has a thickness near the edge of the stacked gate that is thicker than the thickness near the center of stacked gate;
   a drain doping region of the first conductivity type formed under the oxide layer on a side of the stacked gate, wherein the drain doping region is electrically short-circuited with a doping region of the second conductivity type that is formed in the third well region and underneath the drain doping region; and
   a source doping region of the first conductivity type formed under the oxide layer on the other side of the stacked gate;
   wherein when programming the flash memory cell, the third well region and second well region constitute a parasitic capacitor that is charged in few microseconds.

10. The flash memory cell of claim 9 wherein the first conductivity type is N type and the second conductivity type is P type.

11. The flash memory cell of claim 9 wherein the oxide layer extends into the stacked gate with a decreasing thickness to avoid undesired interference.

12. A flash memory cell installed in a semiconductor wafer comprising:

a first well of a first conductivity type formed in the semiconductor wafer;

a second well of a second conductivity type formed beneath the first well wherein a parasitic capacitor is created by the first well and the second well;

a drain terminal formed in a first area of the first well wherein the drain terminal comprises a first doping region of the first conductivity type and asecond doping region of the second conductivity type encompassing the first doping region, and the first doping region and second doping region are electrically short-circuited together;

a source terminal formed in a second area of the first well not overlapped with the first area; and a stacked gate formed on the first well between the drain terminal and the source terminal, the stacked gate having a floating gate above the first well and a control gate above the floating gate;

wherein when programming the flash memory cell, the parasitic capacitor is charged by applying a first voltage to the drain terminal and by grounding the second well, and a second voltage is applied to the control gate.

13. The flash memory cell of claim 12 wherein when programming the flash memory cell, the first voltage is a positive voltage, the second voltage is a negative voltage, the source terminal is floating.

14. The flash memory cell of claim 12 wherein the parasitic capacitor is charged up to the first voltage when programming the flash memory cell.

15. The flash memory cell of claim 12 wherein an oxide layer is located under the floating gate and extends into the floating gate with a decreasing thickness to avoid undesired interference between the floating gate and the source terminal.

* * * * *